(12) United States Patent
Kim et al.

(10) Patent No.: US 7,309,958 B2
(45) Date of Patent: Dec. 18, 2007

(54) ORGANIC LIGHT EMITTING DEVICE COMPRISING BYPASS TRANSISTOR BETWEEN CATHODE AND ANODE AND METHOD OF MANUFACTURING THE SAME

(75) Inventors: Mu-Gyeom Kim, Hwaseong-si (KR); Sang-Yeol Kim, Gwacheon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 479 days.

(21) Appl. No.: 11/056,170

(22) Filed: Feb. 14, 2005

(65) Prior Publication Data
US 2005/0179375 A1 Aug. 18, 2005

(30) Foreign Application Priority Data
Feb. 13, 2004 (KR) ............... 10-2004-0009625

(51) Int. Cl.
*H01J 1/62* (2006.01)
*H01J 63/64* (2006.01)

(52) U.S. Cl. .................. 313/506; 313/500; 313/503; 313/504; 313/505; 313/509; 438/26; 438/27; 438/28; 438/29; 315/169.2; 315/169.3; 428/690; 428/917

(58) Field of Classification Search ........ 313/500, 313/503–506, 509; 315/169.2, 169.3; 428/690, 428/917
See application file for complete search history.

(56) References Cited

U.S. PATENT DOCUMENTS 6,674,234 B2 * 1/2004 Kim et al. .................. 313/506
6,933,673 B2 * 8/2005 Yamazaki .................. 313/506
2001/0050373 A1 * 12/2001 Yamazaki et al. .......... 257/103
2006/0097965 A1 * 5/2006 Deane et al. ................. 345/76
2006/0170336 A1 * 8/2006 Ono et al. .................. 313/504

* cited by examiner

*Primary Examiner*—Lisa Caputo
*Assistant Examiner*—Elmito Breval
(74) *Attorney, Agent, or Firm*—Robert E. Bushnell, Esq.

(57) ABSTRACT

Provided is an organic light emitting device that includes a bypass transistor between a cathode layer and an anode layer and a method of manufacturing the same. The organic light emitting device includes a substrate; a cathode layer and an anode layer separated by a predetermined distance on the substrate; an electron transfer layer and light emitting layer sequentially stacked on the cathode layer; a current control unit that controls current flow between the cathode layer and the anode layer, the current control unit being formed between the cathode layer and the anode layer; a hole transfer layer separated from the current control unit and connecting the light emitting layer and the anode layer; a protective layer formed on the hole transfer layer; a first insulating layer sealed by the protective layer and contacting outer surfaces of a stack stacked on the cathode layer; a second insulating layer surrounding a portion of the current control unit to which an external voltage is applied; and a third insulating layer formed on the substrate around the anode layer, the third insulating layer contacting at least the outer surface of the anode layer and being sealed by the protective layer.

26 Claims, 6 Drawing Sheets

ORGANIC LIGHT EMITTING DEVICE COMPRISING BYPASS TRANSISTOR BETWEEN CATHODE AND ANODE AND METHOD OF MANUFACTURING THE SAME

CLAIM OF PRIORITY

This application makes reference to, incorporates the same herein, and claims all benefits accruing under 35 U.S.C. §119 from an application for ORGANIC LIGHT EMITTING DEVICE COMPRISING BYPASS TRANSISTOR BETWEEN CATHODE AND ANODE AND METHOD OF MANUFACTURING THE SAME earlier filed in the Korean Intellectual Property Office on 13 Feb. 2004 and there duly assigned Ser. No. 10-2004-0009625.

BACKGROUND OF THE INVENTION

1. Field of the Invention

The present invention relates to a light emitting device and a method of manufacturing the same, and more particularly, to an organic light emitting device that includes a bypass transistor interposed between a cathode and an anode and a method of manufacturing the same.

2. Description of the Related Art

Organic light emitting devices can be categorized into bottom emission type and top emission type according to the direction in which light is emitted.

With respect to the efficiency of emitting light, an organic light emitting device having the top emission structure is superior to one having the bottom emission structure. For this reason, organic light emitting devices having a top emission structure are widely used.

To drive an organic light emitting device, a driving device such as an MOSFET (metal-oxide semiconductor field-effect transistor) or TFT (thin film transistor) is required. Currently, for conventional organic light emitting devices, at least three MOSFETs or TFTs are used. Moreover, each of the transistors and organic light emitting devices are independently formed. That is, after forming a transistor, an organic light emitting device is formed on the transistor.

A conventional organic light emitting device requires at least three MOSFETs or TFTs, thus requiring a large area for mounting and having high power consumption. Also, since the transistors and the organic light emitting devices have to be manufactured independently, a manufacturing process takes a long time to complete, and thus, productivity is low. Also, the yield is reduced.

Generally, overshooting problems can occur due to a sudden increase in signals while driving an organic light emitting device by applying periodical signals. In the case of a conventional organic light emitting device, this problem can be solved by a change in circuitry. However, this solution requires more transistors, and therefore, the size of region occupied by the unit cell is further increased.

SUMMARY OF THE INVENTION

The present invention provides an organic light emitting device that can maximize the practical use efficiency of space, reduce a process time to increase productivity, and improve the overshooting problems.

The present invention also provides a method of manufacturing the organic light emitting device.

It is another object of the present invention to include an organic light emitting device that has less than two transistors for the purpose of driving the organic light emitting device.

It is yet another object of the present invention to provide the organic light emitting device to have the volume of a unit cell and power consumption being reduced.

It is another object of the present invention to provide a transistor and an organic light emitting device being formed in the same operation, thereby reducing the number of processes and increasing productivity.

It is still another object of the present invention to provide an organic light emitting device that prevents a conventional over shooting problem by including a bypass transistor between a cathode layer and an anode layer.

According to an aspect of the present invention, there is provided a light emitting device including: a substrate; a cathode layer and an anode separated by a predetermined distance on the substrate; an electron transfer layer and light emitting layer sequentially stacked on the cathode layer; a current control unit that controls current flow between the cathode layer and the anode layer, the current control unit being formed between the cathode layer and the anode layer; a hole transfer layer separated from the current control unit and connecting the light emitting layer and the anode layer; a protective layer formed on the hole transfer layer; a first insulating layer sealed by the protective layer and contacting outer surfaces of the layers stacked on the cathode layer; a second insulating layer surrounding a portion of the current control unit to which an external voltage is applied; and a third insulating layer formed on the substrate around the anode layer, the third insulating layer contacting at least the outer surface of the anode layer and being sealed by the protective layer.

The light emitting device may further include a metal layer separated from the anode layer on the substrate beyond the outer edge of the anode layer and a switching device for switching a voltage applied to the anode layer, disposed between the anode layer and the cathode layer.

The current control unit may be a transistor which includes a channel that connects the anode layer and the cathode layer, and a first gate separated a predetermined distance from the channel.

According to another aspect of the present invention, there is provided a method of manufacturing a light emitting device, including: forming a cathode layer and an anode layer separated from each other on a substrate; forming a first channel between the cathode layer and the anode layer; forming a first insulating layer on the cathode layer and the anode layer, the first insulating layer exposing portions of the cathode layer and the anode layer and covering the first channel; forming a first gate on the first insulating layer; forming a second insulating layer covering the first gate on the first insulating layer; sequentially forming an electron transfer layer and a light emitting layer on the exposed portion of the cathode layer; forming a third insulating layer separated from the first gate on the second insulating layer; forming a hole transfer layer connected to the anode layer on the light emitting layer; and forming a protective layer to seal the first to third insulating layers formed around the hole transfer layer on the entire surface of the hole transfer layer.

The forming of the cathode layer and the anode layer may further include forming a metal layer, the anode layer and the cathode layer are formed on a predetermined region of the substrate separated from the anode layer.

The forming of the first channel may further include forming a second channel between the anode layer and the metal layer.

The forming of the first insulating layer may further include extending the first insulating layer on the metal layer with the second channel covering.

The forming of the first gate may further include forming a second gate on the first insulating layer formed on the second channel.

The first and/or second channels may be first doped regions formed by injecting a conductive dopant and/or material layers formed on the substrate.

The magnetic layer may include a lower electrode, a hard magnetic film, a tunneling film, a soft magnetic film, and an upper electrode stacked sequentially; a first spacer interposed between side surfaces of the lower electrode, the hard magnetic layer, the tunneling film and the soft magnetic film, and the anode layer; and a second spacer interposed between side surfaces of the hard magnetic film, the tunneling film, the soft magnetic film and the upper electrode, and the cathode layer.

According to another aspect of the present invention, there is provided a method of manufacturing a light emitting device, including: forming a cathode layer and an anode layer separated from each other on a substrate; forming a first gate on the substrate between the cathode layer and the anode layer; forming a first insulating layer on a predetermined region of the cathode layer separated from the first gate, and filling a gap between the cathode layer and the anode layer with the first insulating film to cover the first gate; forming a first channel that connects the cathode layer and the anode layer on the first insulating layer on which the first gate is formed; forming a second insulating layer that covers the first channel and exposes portions of the cathode layer and the anode layer while forming the second insulating layer on the first insulating layer separated from the first gate; sequentially forming an electron transfer layer and a light emitting layer on the exposed region of the cathode layer; forming a third insulating layer on the second insulating layer separated from the first gate; forming a hole transfer layer connected to the anode layer; and forming a protective layer to seal the first to third insulating layers formed around the hole transfer layer on the entire surface of the hole transfer layer.

The method may further include forming a metal layer on a predetermined region of the substrate separated from the anode layer. Also, the method may further include forming a second gate on the substrate between the anode layer and the cathode layer.

The first insulating layer may fill a gap between the cathode layer and the anode layer, and covers the second gate. Also, the method may further include forming a second channel on a portion of the first insulating layer formed on the second gate, and may further include forming the second insulating layer on the second channel.

The first channel may be formed of a material selected from the group of a semiconductor layer, a magnetic layer, and an organic semiconductor layer.

Here, the magnetic layer may include a lower electrode, a hard magnetic layer, a tunneling film, a soft magnetic layer, and an upper electrode stacked sequentially; and a spacer that covers a stack composed of the lower electrode, the hard magnetic film, the tunneling film, and the soft magnetic film. At this time, the soft magnetic film is composed of a magnetic material having linear polarization for a range of voltages applied to the first gate.

A resistance region may be formed in the cathode layer.

The organic light emitting device according to the present invention includes less than two transistors for driving the organic light emitting device, thereby reducing volume of a unit cell and power consumption. Also, a transistor and an organic light emitting device can be formed in the same process, thereby reducing the number of processes required for manufacturing and increasing productivity. The organic light emitting device according to the present invention includes a bypass transistor interposed between a cathode and an anode. The bypass transistor can detour a portion of a signal when the frequency of the signal is suddenly increased during the operation of the organic light emitting device. Therefore, the use of the organic light emitting device according to the present invention prevents overshooting.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
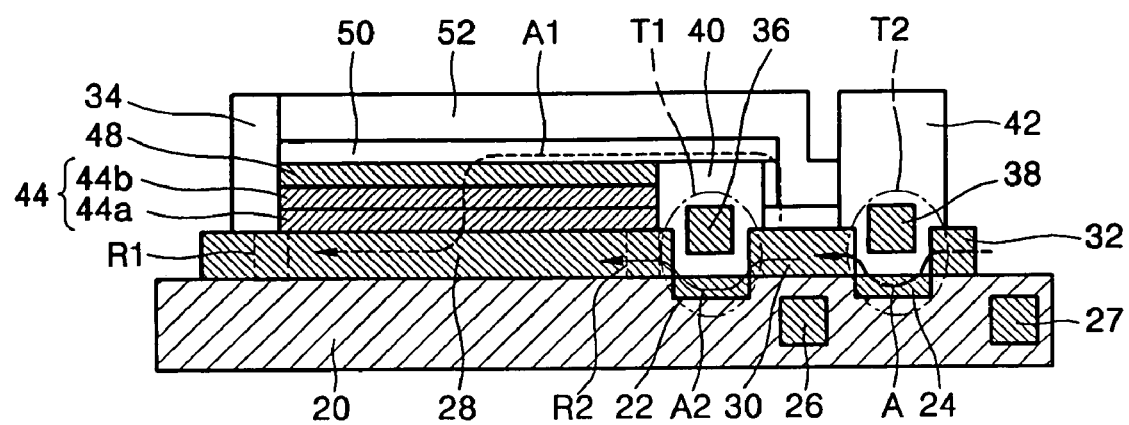
FIG. 1 is a cross-sectional view of an organic light emitting device according to a first embodiment of the present invention.

The present invention will now be described more fully with reference to the accompanying drawings in which embodiments of the present invention are shown. In the drawings, the thicknesses of layers and regions are exaggerated for clarity. Throughout the drawings, like reference numerals refer to like elements.

An organic light emitting device according to the embodiment of the present invention will now be described.

FIRST EMBODIMENT

Referring to FIG. 1, an organic light emitting device according to a first embodiment of the present invention (hereinafter, first organic light emitting device) includes first through third metal layer patterns 28, 30, and 32 composed of aluminum formed on a substrate 20. The substrate may be an n-type silicon substrate. A thickness of the first through third metal layer patterns 28, 30 and 32 is approximately 2,500–3,000 Å (Angstroms). The first through third metal layer patterns 28, 30, and 32 are spaced apart by predetermined distances. An area occupied by the first metal layer pattern 28 is broader than those of the second and third metal layer patterns 30 and 32. The first metal layer pattern 28 is a cathode layer and the second metal layer pattern 30 is an anode layer. The third metal layer pattern 32 is connected to an external power source. An address line 26 and a power supply line 27 are disposed in the substrate 20. The two lines of the address line 26 and the power supply line 27 are separated or spaced apart by a predetermined distance. The address line 26 locates under the second metal layer pattern 30, and the power supply line 27 is disposed on the outside of the third metal layer pattern 32. The address line 26 and the power supply line 27 may be an aluminum line with a thickness of approximately 250 nm (nanometers). A first doped region 22 is disposed on the substrate 20 between the first metal layer pattern 28 and the second metal layer pattern 30. A second doped region 24 is disposed on the substrate 20 between the second metal layer pattern 30 and the third metal layer pattern 32. The first and second doped regions 22 and 24 are doped with a p-type conductive dopant and form a channel region of a transistor. A first insulating layer 34 is formed with a predetermined height on a predetermined region of the first metal layer pattern 28. A second insulating layer 40 covering the first doped region 22 is formed between the first metal layer pattern 28 and the second metal layer pattern 30. The second insulating layer 40 has a predetermined height and covers portions of the first and second metal pattern layers 28 and 30. The second insulating layer 40 includes a first gate 36. The first gate 36, the first doped region 22, and the first and second metal layer patterns 28 and 30 constitute a first transistor T1. The first transistor T1 controls an amount current input to the first organic light emitting device and controls a flow of current from an anode layer, i.e., the second metal layer pattern 30, to a cathode layer, i.e., the first metal layer pattern 28. That is, an amount of current input to the first metal layer pattern 28 via the first doped region 22 increases or decreases in proportion to the voltage applied to the first gate 36 of the first transistor T1.

When the amount of current input to the first metal layer pattern 28 via the first doped region 22 is large, an amount of current supplied to an organic light emitting layer 48 via the hole transfer layer 50 decreases, and therefore, an amount of light emitted from the organic light emitting layer 48 decreases. That is, brightness of the first organic light emitting device decreases. On the other hand, when the amount of current input to the first metal layer pattern 28 via the first doped region 22 is small, the amount of current supplied to the organic light emitting layer 48 via the hole transfer layer 50 increases, and therefore, the amount of light emitted from the organic light emitting layer 48 increases, thereby increasing brightness of the first organic light emitting device.

Since the current supplied to the organic light emitting layer 48 depends on the voltage applied to the first gate 36 of the first transistor T1 and the amount of light emitted from the organic light emitting layer 48 varies according to the current, brightness of a first organic light emitting device can easily be controlled by controlling the voltage applied to the first gate 36.

A third insulating layer 42 is interposed between the second metal layer pattern 30 and the third metal layer pattern 32 covering the second doped region 24. The third insulating layer 42 can be composed of the same insulating material as the first and second insulating layers 34 and 40, such as a silicon oxide film (SiO$_2$), or can be composed of another insulating material such as a nitride film, or the three insulating layers 34, 40 and 42 can be formed of different materials. The third insulating layer 42 covers portions of the second and third metal layer patterns 30 and 32. The second insulating layer 40 and the third insulating layer 42 are separated a predetermined distance on the second metal layer pattern 30. A second gate 38 is included in the third insulating layer 42. The second gate 38 can be formed close or adjacent to the second doped region 22 and connected to the address line 26. The second gate 38, the second doped region 22, and the second and third metal layer patterns 30 and 32 constitute a second transistor T2. The second transistor T2 is used to drive the first organic light emitting device. That is, when power is applied to the second gate via the address line 26, current flows through the second doped region 22 due to an electric field and then a channel between the second and third metal layer patterns 30 and 32 is opened. As a result, due to a driving voltage applied to the third metal layer pattern 32 via the power supply line 27, current flows toward the first transistor T1 via the second transistor T2 as indicated by a first arrow A. When a predetermined voltage is applied to the first gate 36 of the first transistor T1, a portion of the current applied to the first transistor T1 flows to the cathode layer, i.e., the first metal layer pattern 28 via the first doped region 22 as indicated by a third arrow A2, and the rest of the current enters the organic light emitting layer 48 via the hole transfer layer 50 as indicated by a second arrow A2, the current flowing from the first transistor T1 to the cathode layer is proportional to the magnitude of the applied voltage. Also, voltage drop caused by the current flowing into the first metal layer pattern 28 can be lower than a voltage applied to the first gate 36 for turning on the first transistor T1. To balance the current ratio between the current flowing into the first metal layer pattern 28 via the first doped region 22 and the current flowing into the organic light emitting layer 48 via the hole transfer layer 50, resistance regions R1 and R2 can be included in a predetermined region of the first metal layer pattern 28. A dopant can be injected into the resistance regions R1 and R2.

An electron transfer layer 44 and the organic light emitting layer 48 are sequentially formed on the first metal layer pattern 28 between the first insulating layer 34 and the second insulating layer 40. The electron transfer layer 44 can be composed of a material having an appropriate work function for easily transmitting electrons from the first metal layer pattern 28 to the organic light emitting layer 48. The electron transfer layer 44 includes sequentially stacked a first and second electron transfer layers 44a and 44b stacked sequentially. The first electron transfer layer 44a can be a calcium (Ca) layer, and the second electron transfer layer 44b can be a barium fluoride (BaF$_2$) layer or a lithium fluoride layer. Thicknesses of the first and second electron transfer layers 44a and 44b are approximately 5 nm and 2 nm, respectively. The electron transfer layer 44 can be a single layer such as a barium (Ba) layer. The organic light emitting layer 48 emits light by coupling holes and electrons. The light is emitted upward from the organic light emitting layer 48. The organic light emitting layer 48 has a thickness of approximately 80 nm, and can be a low molecular fluorescent layer, a polymer fluorescent layer, or a phosphorescence layer emitting green, red, or blue light. The organic light emitting layer 48 is formed to a height equal to the height of the second insulating layer 40.

The hole transfer layer 50 and a protective layer 52 are sequentially formed between the first insulating layer 34 and the third insulating layer 42. A thickness of the hole transfer layer is approximately 50 nm. The hole transfer layer 50 contacts the entire surface of the organic light emitting layer 48, covers the entire surface of the second insulating layer 40, and contacts the entire surface of the second metal layer pattern 30 between the second insulating layer 40 and the third insulating layer 42. Since the work function of the hole transfer layer 50 is similar to that of the second metal layer pattern 24b, holes can be easily injected into the hole transfer layer 50. Since, the holes must be transferred through the entire surface of the organic light emitting layer 48, the hole transfer layer 50 is preferably formed of a material having high conductivity. The protective layer 52 protects the stacked layers below from impurities, especially moisture. Therefore, another means that performs the same function as the protective layer 52 may be employed. The protective layer 52 contacts an exposed surface of the hole transfer layer 50, and the ends of the protective layer 52 are sealed by the first and third insulating layers 34 and 42. The protective layer 52 can be a glass layer or a thin film such as a gold film. Also, the protective layer 52 and the first and third insulating layers 34 and 42 can be sealed by a predetermined sealing material such as a UV resin.

Figure 2:
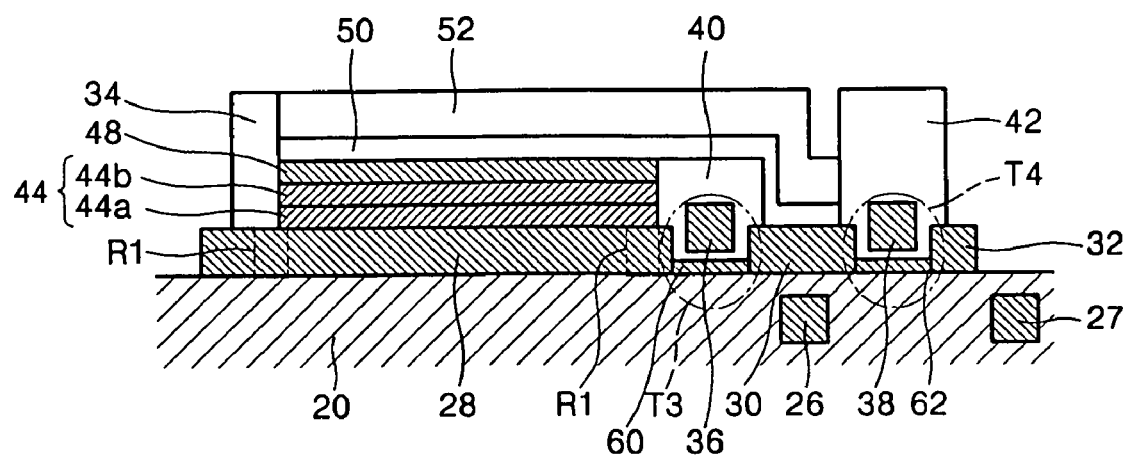
FIG. 2 is a cross-sectional view of an organic light emitting device according to a second embodiment of the present invention.
Figure 3:
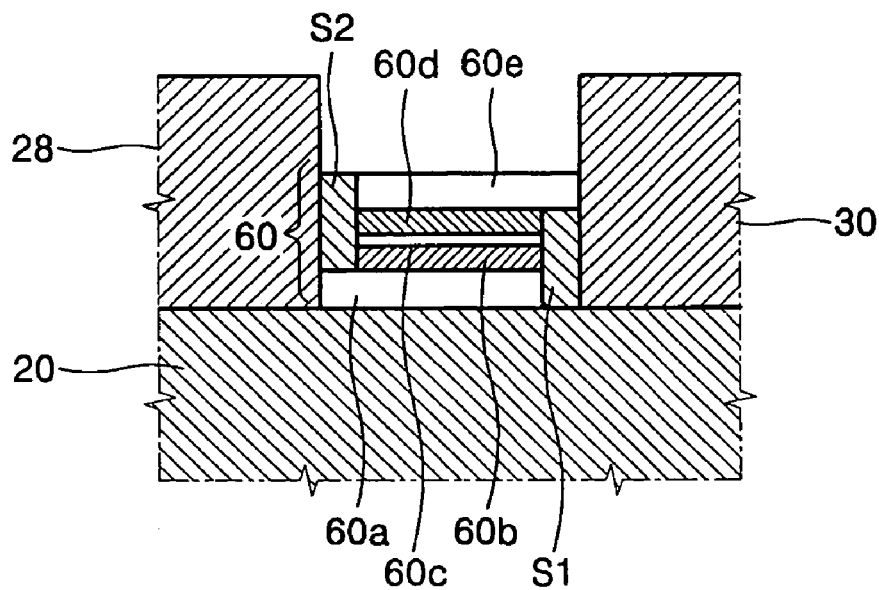
FIG. 3 is a magnified cross-sectional view of the channel region of the organic light emitting device of FIG. 2.

The first through third insulating layers 34, 40, and 42 in FIGS. 1 through 3 are depicted as a single layer, however, each of the insulating layers can include a plurality of layers composed of different materials.

SECOND EMBODIMENT

An aspect of the organic light emitting device (hereinafter, a second organic light emitting device) according to the second embodiment of the present invention is that the channel of the transistor is formed on a substrate, not recessed into the substrate.

Referring to FIG. 2, the second organic light emitting device is almost identical to the first organic light emitting device, but a first channel layer 60 between the first and second metal layer patterns 28 and 30 and a second channel layer 62 between the second and third metal layer patterns 30 and 32 are disposed on the substrate 20. First and second channel layers 60 and 62 perform the same function as the first and second doped regions 22 and 24 in the first organic light emitting device depicted in FIG. 1. The first channel layer 60, the first and second metal layer patterns 28 and 30, and a first gate 36 constitute a third transistor T3. The second channel layer 62, the second and third metal layer patterns 30 and 32, and a second gate 38 constitute a fourth transistor T4. The third and fourth transistors T3 and T4 perform the same functions as the first and second transistor in the first organic light emitting device, respectively. The first channel layer 60 of the third transistor T3 can be an organic semiconductor layer such as a doped semiconductor layer, a magnetic layer, or a pentacene layer. When the first channel layer 60 is a magnetic layer, the first channel layer 60, as depicted in FIG. 3, can include a lower electrode 60a contacts the first metal layer pattern 28, a hard magnetic film 60b, a tunneling film 60c, a soft magnetic film 60d, and an upper electrode 60e contacts the second metal layer pattern 30 sequentially formed on the substrate 20. The first channel layer 60 can also include a first spacer S1 interposed between the lower electrode 60a, the hard magnetic film 60b, the tunneling film 60c and the soft magnetic film 60d, and the second metal layer pattern 30, and a second spacer S2 between sides of the hard magnetic film 60b, the tunneling film 60c, the soft magnetic film 60d and the upper electrode 60e, and the first metal layer pattern 28. The hard magnetic film 60b is a magnetic material film in the spins of molecules is fixed regardless of the magnetic field externally applied. On the other hand, the soft magnetic film 60d is a magnetic material film in which spins of molecules are arranged in a same direction or an opposite direction of the spin of the hard magnetic film 60b according to the magnetic field applied externally. When the spins of molecules in the soft magnetic film 60d are in the same direction as the spins of molecules in the hard magnetic film 60b, the resistance of the first channel layer 60 is minimized, that is, a current input to the first metal layer pattern 28 via the first channel layer 60 is maximized. On the other hand, when the spins of the molecules in the soft magnetic film 60d are arranged in an opposite direction to the spins of the molecules in the hard magnetic film 60b, the resistance of the first channel layer 60 is maximized, therefore, a current input to the first metal layer pattern 28 is minimized. That is, the molecules of the soft magnetic film 60d with spins arranged in the same direction as the spins of molecules in the hard magnetic film 60b, the more current that flows to the first metal layer pattern 28 via the first channel layer 60.

As seen in FIGS. 2 and 3, the current flowing into the first metal layer pattern 28 via the first channel layer 60 should not increase according to the voltage applied to the first gate 36 as in the first organic light emitting device in which the current flowing into the first metal layer pattern 28 via the first doped region 22 (FIG. 1) increases according to the voltage applied to the first gate 36. Therefore, when the first channel region 60 is a magnetic layer, the soft magnetic film 60d can be at least a magnetic material film having linear polarization within a range of voltage applied to the first gate 36.

The second channel layer 62 can also be configured the same as the first channel layer 60.

THIRD EMBODIMENT

An aspect of an organic light emitting device (hereinafter, a third organic light emitting device) according to a third embodiment of the present invention is that a channel of a transistor is formed above a gate.

Figure 4:
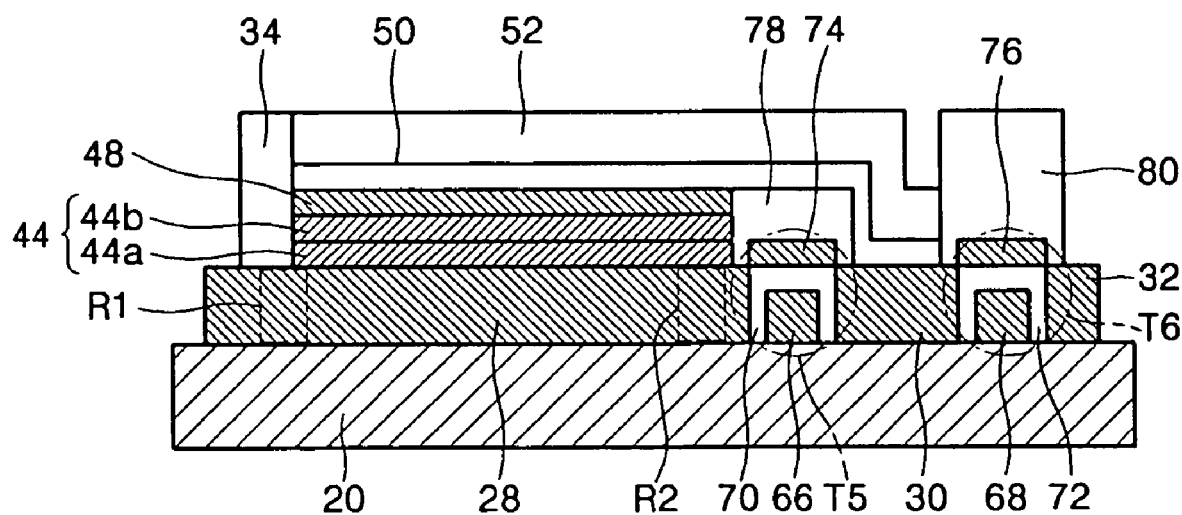
FIG. 4 is a cross-sectional view of an organic light emitting device according to a third embodiment of the present invention.
Figure 5:
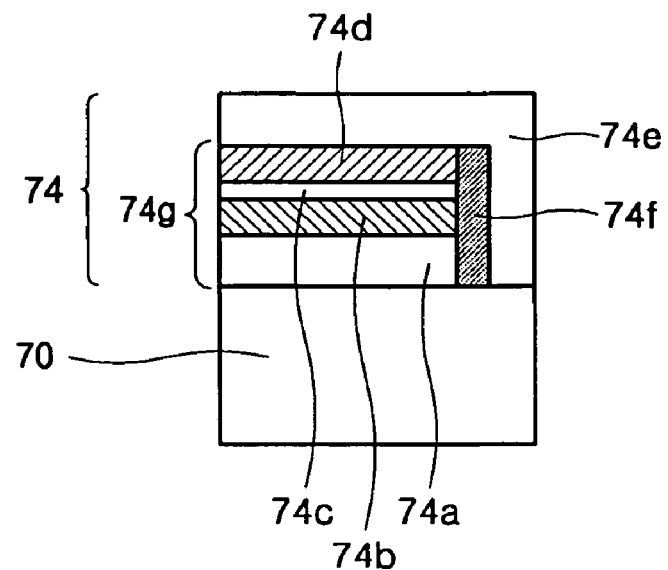
FIG. 5 is a magnified cross-sectional view of the channel region of the organic light emitting device of FIG. 3.

Referring to FIG. 4, a third gate 66 is formed between the first and second metal layer patterns 28 and 30 on a substrate 20. The third gate 66 does not contact the first and second metal layer patterns 28 and 30, and performs the same function as the first gate in the first organic light emitting device. A fourth gate 68 with the same shape as the third gate 66 is formed between the second and third metal layer patterns 30 and 32 on the substrate 20. The fourth gate 68 performs the same function as the second gate in the first organic light emitting device. A fourth insulating layer 70 is disposed above the third gate 66 between the first and second metal layer patterns 28 and 30 and the third gate 66. The fourth insulating layer 70 can be planarized to the same height as the first and second metal layer patterns 28 and 30. A fifth insulating layer 72 is disposed above the fourth gate 68 between the second and third metal layer patterns 30 and 32 and the fourth gate 68. The fifth insulating layer 70 can be planarized to the same height as the second and third metal layer patterns 30 and 32. The fourth and fifth insulating layers 70 and 72 can be silicon oxide layers composed of $SiO_2$. The fourth and fifth insulating layers 70 and 72 can have thicknesses of 1000-1500 Å. A third channel layer 74 connected to the first and second metal layer patterns 28 and 30 and a fourth channel layer 76 connected to the second and third metal layer patterns 30 and 32 are respectively formed on the fourth insulating layer 70 and the fifth insulating layer 72. The third channel layer 74 of the third organic light emitting device, as seen in FIGS. 4 and 5, performs the same function as the first channel layer 60 in FIG. 2 in the second organic light emitting device, and can be composed of the same material as the first channel layer 60. The fourth channel layer 76 performs the same function as the second channel layer 62. The third channel layer 74, the third gate 66, and the first and second metal layer patterns 28 and 30 constitute a fifth transistor T5, and the fourth channel layer 76, the fourth gate 68, and the second and third metal layer patterns 30 and 32 constitute a sixth transistor T6. The fifth and sixth transistors T5 and T6 of the third organic light emitting device perform the same functions as the third and fourth transistors T3 and T4 in the second organic light emitting device, respectively.

When the third channel layer 74 includes a magnetic layer, the third channel layer 74 can be structured as depicted in FIG. 5.

More specifically, referring to FIG. 5, the third channel layer 74 includes a lower electrode 74a, a hard magnetic film 74b, a tunnelling film 74c, a soft magnetic film 74d, and an upper electrode 74e sequentially stacked on a predetermined region of the fourth insulating layer 70. The third channel layer 74 also includes a spacer 74f that prevents the lower electrode 74a, the hard magnetic film 74b, and the tunnelling film 74c from contacting the upper electrode 74e. The spacer 74f is formed between a side surface of a stack 74g composed of the lower electrode 74a, the hard magnetic film 74b and the tunnelling film 74c, and a portion extended along a side surface of the stack 74g of the upper electrode 74e. The lower electrode 74a is connected to the first metal layer pattern 28, and an extended portion of the upper electrode 74e is connected to the second metal layer pattern 30.

Referring to FIG. 4, the third channel layer 74 is covered by the sixth insulating layer 78, and the fourth channel layer 76 is covered by the seventh insulating layer 80. The sixth insulating layer 78 insulates the third channel layer 74 from the hole transfer layer 50, an electron transfer layer 44, and an organic light emitting layer 48. The fourth insulating layer 76 is insulated by the seventh insulating layer 80 from the hole transfer layer 50. The remaining elements of the third organic light emitting device are identical to the elements of the first or the second organic light emitting devices.

Figure 6:
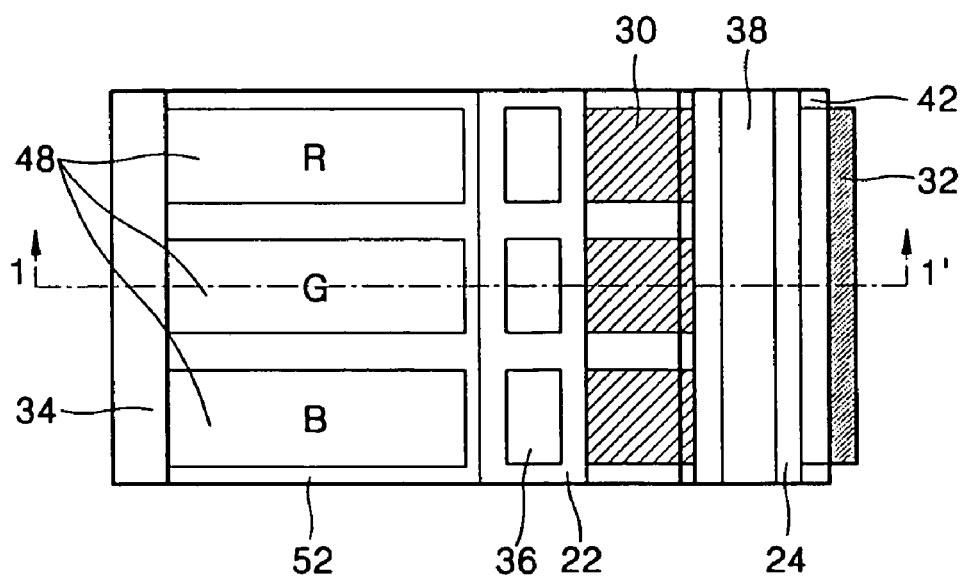
FIG. 6 is a plan view of R (red), G (green), and B (blue) color pixels composed of organic light emitting devices according to an embodiment of the present invention.

FIG. 6 is a plan view of red, green, and blue color pixels including a plurality of the first organic light emitting devices according to an embodiment of the present invention. FIG. 1 is a cross-sectional view taken along a line 1-1' of FIG. 6.

Referring to FIG. 6, the first gate 36 is divided into each of the red, green, and blue pixels. However, the second gate 38 is included in only one pixel. The second gate 38 is commonly used by the three pixels.

Results of experiments for verifying characteristics of the organic light emitting devices according to embodiments of the present invention will now be described.

The first organic light emitting device was used. To measure current density supplied to the test organic light emitting device and brightness of the test organic light emitting device with respect to driving voltage, various voltages were applied to the first gate 36.

Figure 7:
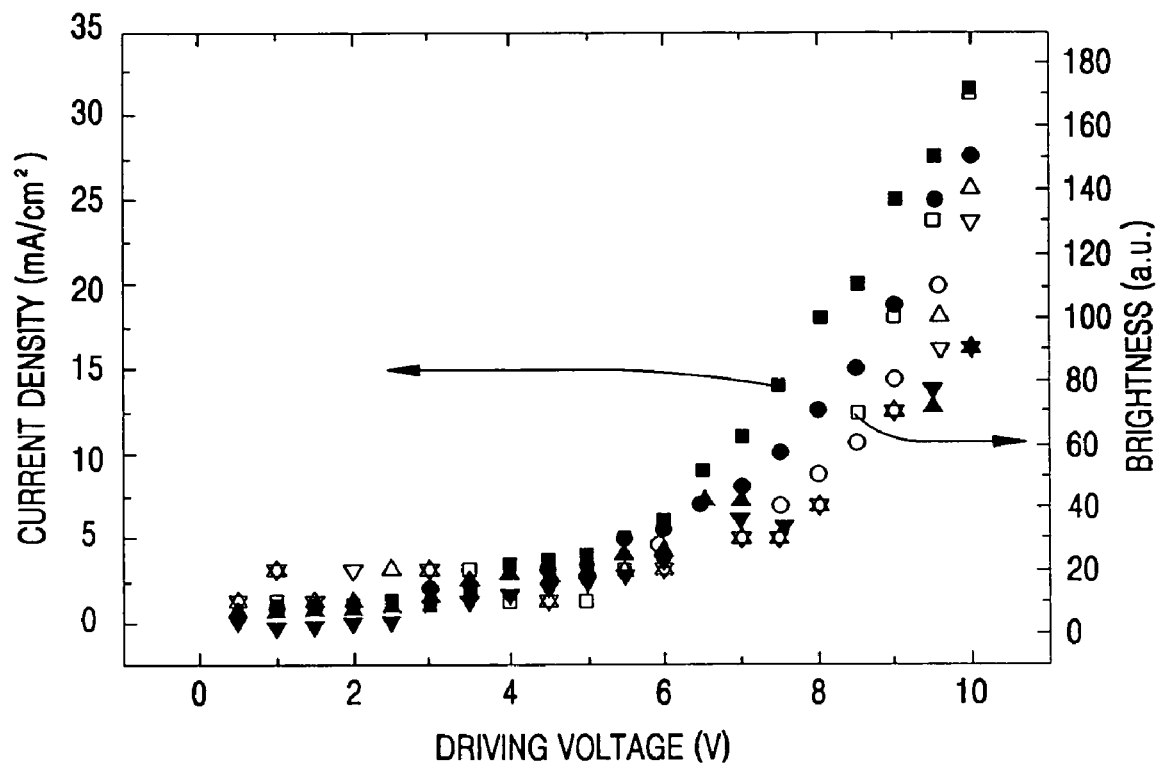
FIG. 7 is a graph illustrating current-voltage-brightness with respect to the organic light emitting device depicted in FIG. 1, FIG. 2 or FIG. 3.

FIG. 7 is a graph showing the results of the experiment. Reference symbol ■ indicates the case when a bias voltage is not applied to the first gate 36. Reference symbols ●, ▲ and ▼ indicate the cases when applying control voltages of 0.6 V, 1.2 V, and 1.8 V to the first gate 36, respectively.

Referring to FIG. 7, in all cases, as the voltage applied to the third metal layer pattern 32 was increased, the current density and brightness of the organic light emitting device increased, but as the control voltage applied to the first gate 36 was increased, rate at which the current density and brightness increased was decreased. This is because a portion of current supplied through the hole transfer layer 50 flowed into the cathode layer, i.e., the first metal layer pattern 28, via the first doped region 22.

This result also indicates that the brightness of the organic light emitting device according to an embodiment of the present invention can be controlled by controlling the voltage applied to the first gate 36.

A method of manufacturing the first through the third organic light emitting device according to embodiments of the present invention will now be described.

Referring to FIGS. 1, 2, and 4, the structures of the first through the third organic light emitting devices of the present invention are almost the same except for the location and configuration of channels. Therefore, methods of manufacturing the second and third organic light emitting devices will be omitted.

Figure 8:
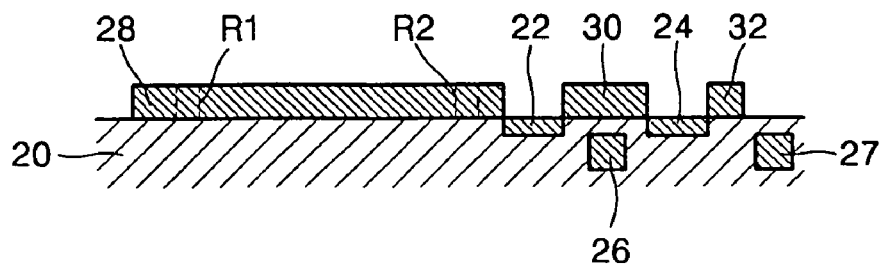
FIGS. 8 through 12 are cross-sectional views illustrating a method of manufacturing the organic light emitting device depicted in FIG. 1.

Referring to FIG. 8, an address line 26 and a power supply line 27 are formed in a substrate 20. The substrate 20 may be an n-type silicon substrate. Each of the address line 26 and the power supply line 27 can be a predetermined conductive line such as an aluminum line with a thickness of approximately 250 nm (nanometers).

Next, a metal layer (not shown) is formed on the substrate 20. The metal layer may be formed to a thickness of 2,500-3,000 Å (Angstroms). The metal layer may be formed with an aluminium layer. First through third metal layer patterns 28, 30, and 32 separated by predetermined distances are formed by patterning the metal layer on the substrate 20. The first metal layer pattern 28, which is used as a cathode layer, is wider than the second and third metal layer patterns 30 and 32. The second metal layer pattern 30 is used as an anode layer, and the third metal layer pattern 32 is connected to the power supply line 27.

Next, a predetermined conductive dopant such as an n-type conductive dopant, which is an opposite type to a dopant injected into the substrate 20, is injected into the front surface of the substrate 20. It is preferable that the dopant injected does not penetrate into the first through third metal layer patterns 28, 30, and 32. Therefore, it is preferable that the ion injection energy is adequately controlled. A first doped region 22 with a predetermined depth is formed in the substrate 20 between the first and second metal layer patterns 28 and 30. Also, a second doped region 24 with a predetermined depth is formed in the substrate 20 between the second and third metal layer patterns 30 and 32. The first through third metal layer patterns 28, 30, and 32 may be arranged such that the second doped region 24 is formed between the address line 26 and the power supply line 27 and the first doped region 22 is formed in the left side of the address line 26.

First and second resistance regions R1 and R2 are formed by injecting a dopant into the first metal layer pattern 28. The first and second resistance regions R1 and R2 are separated by a predetermined distance. The first and second resistance regions R1 and R2 are to maintain a ratio of a current flowing from the second metal layer pattern 30 to the first metal layer pattern 28 through the first doped region 22 and a current flowing from the second metal layer pattern 30 to the first metal layer pattern 28 via a hole transfer layer which will be formed in the subsequent process.

Figure 9:
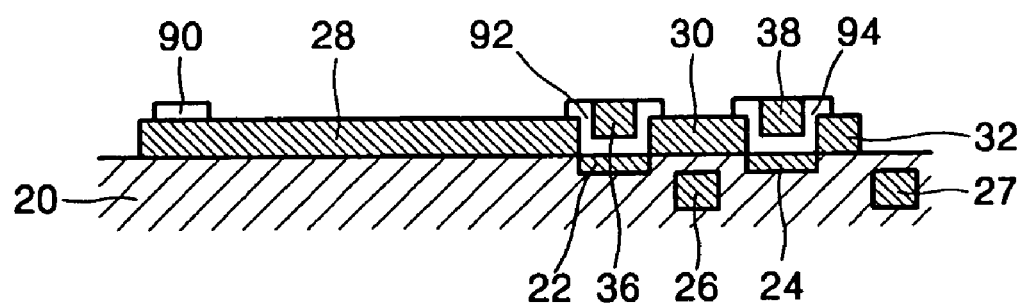

Referring to FIG. 9, an eighth insulating layer 90 is formed on a predetermined region of the first metal layer pattern 28. At the same time, a ninth insulating layer 92 covering the first doped region 22 is formed on the first and second metal layer patterns 28 and 30, and a tenth insulating layer 94 covering the second doped region 24 is formed on the second and third metal layer patterns 30 and 32. The eighth through tenth insulating layers 90, 92, and 94 can be formed using a masking method with a mask that covers the rest of the regions except the regions where the eighth through tenth insulating layers 90, 92, and 94 are to be formed. The eighth and ninth insulating layers 90 and 92 define a region for forming an organic light emitting layer in the first metal layer pattern 28. The ninth and tenth insulating layers 92 and 94 define an exposure region of the second metal layer pattern 30, and a hole transfer layer which will be formed in a subsequent process will contact the exposed region of the second metal layer pattern 30. The eighth through tenth insulating layers 90, 92, and 94 may be formed to a thickness of 1,000-1,500 Å (Angstroms). The thickness of each of the eighth through tenth insulating layers 90, 92, and 94 is thinner than those of the first through third metal layer patterns 28, 30, and 32. Therefore, even if the ninth insulating layer 92 is formed between the first and second metal layer patterns 28 and 30, and the tenth insulating layer 94 is formed between the second and third metal layer patterns 30 and 32, a step profile between the first through third metal layer patterns 28, 30, and 32 and the substrate 20 remains unchanged. Accordingly, a surface of the ninth and tenth insulating layers 92 and 94 has a concave shape corresponding to the step profile. A first gate 36 and a second gate 38, are respectively formed in the concave regions of the ninth and tenth insulating layers 92 and 94 using the masking method. Then, the mask used to form the first and second gates 36 and 38 is removed. Thus, a first transistor T1 that includes the first gate 36, the first doped region 22, and the first and second metal layer patterns 28 and 30 is formed, and also a second transistor T2 that includes the second gate 38, the second doped region 24, and the second and third metal layer patterns 30 and 32 is formed. The first transistor T1 is used as a current control unit that controls current flowing from the second metal layer pattern 30 which is used as an anode layer to the first metal layer pattern 28 which is used as a cathode layer. The second transistor T2, which is a switching device, controls that a driving voltage applied through the third metal layer pattern 32 is applied to the second metal layer pattern 30.

Figure 10:
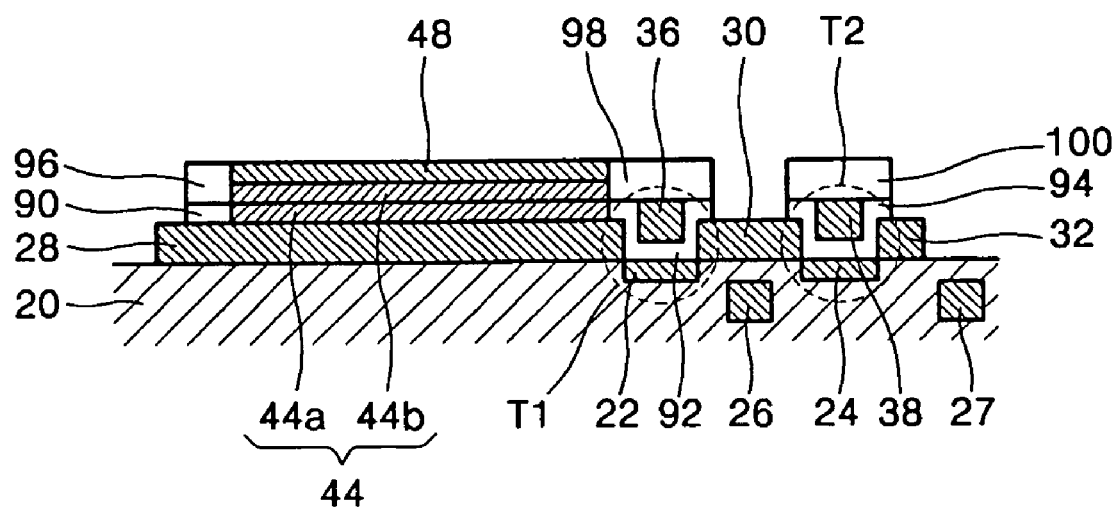

Referring to FIG. 10, an eleventh insulating layer 96 is formed on the eighth insulating layer 90, and, at the same time, a twelfth insulating layer 98 covering the first gate 36 is formed on the ninth insulating layer 92. Also, a thirteenth insulating layer 100 covering the second gate 38 is formed on the tenth insulating layer 94. Each of the eleventh through thirteenth insulating layers 96, 98, and 100 can be formed of a predetermined oxide film such as a silicon oxide film.

An electron transfer layer 44 and an organic light emitting layer 48 are sequentially formed in seriatim on the first metal layer pattern 28 between the eighth and ninth insulating layers 90 and 92 using a lift off method. The electron transfer layer 44 and the organic light emitting layer 48 are formed to the same height as the eleventh and twelfth insulating layers 96 and 98. The electron transfer layer 44 is formed by sequentially stacking first and second electron transfer layers 44a and 44b. The first electron transfer layer 44a can be a calcium (Ca) layer with a thickness of about 5 nm (nanometers). The second electron transfer layer 44b can be a barium fluoride (BaF$_2$) layer or a lithium fluoride (LiF) layer with a thickness of about 2 nm (nanometers). The electron transfer layer 44 can also be a single layer such as a Ba layer. The organic light emitting layer 48 can be a predetermined fluorescent material layer such as one of a low molecule fluorescent layer, a polymer fluorescent layer, and a phosphorescence layer which can emit one of green, red and blue light. The organic light emitting layer 48 is formed to a thickness of approximately 80 nm (nanometers).

Figure 11:
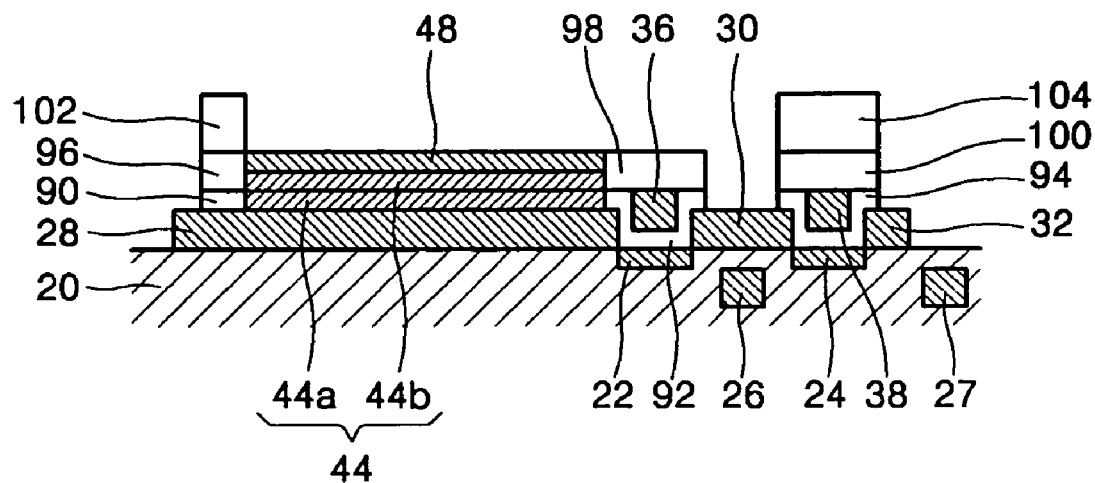

Referring to FIG. 11, fourteenth and fifteenth insulating layers 102 and 104 are formed on the eleventh and thirteenth insulating layers 96 and 100, respectively. Each of the fourteenth and fifteenth insulating layers 102 and 104 may be a predetermined oxide film such as a silicon oxide film.

Figure 12:
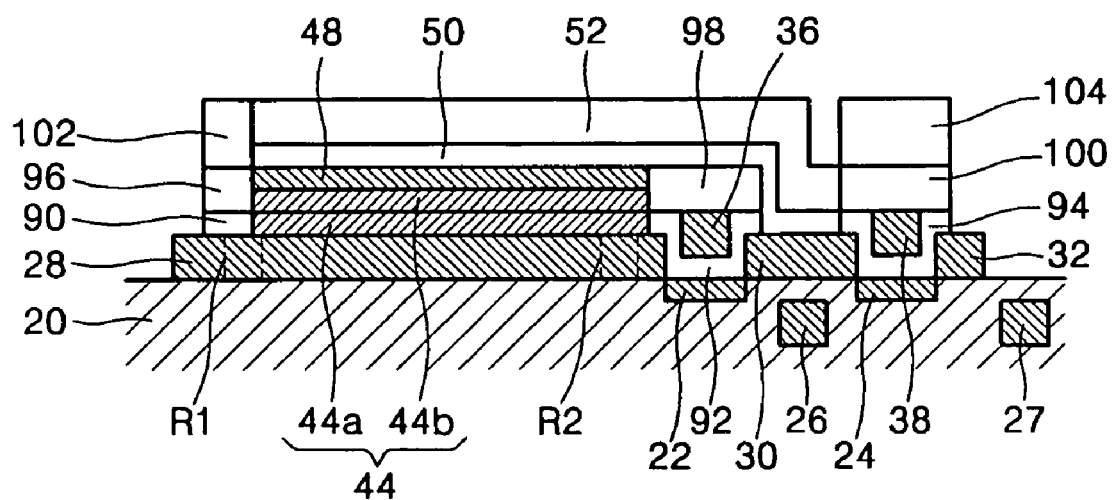

Referring to FIG. 12, a hole transfer layer 50 and a protective layer 52 are formed between the fourteenth and fifteenth insulating layers 102 and 104. The hole transfer layer 50 covers the organic light emitting layer 48 and an exposed portion of the twelfth insulating layer 98, and contacts the second metal layer pattern 30. The protective layer 52 is adhered to the exposed entire surface of the hole transfer layer 50 and contacts the fourteenth and fifteenth insulating layers 102 and 104 for sealing. Holes supplied from the second metal layer pattern 30 must be transferred into the entire surface of the organic light emitting layer 48. Therefore, it is preferable that the hole transfer layer 50 is composed of a material having high conductivity. The protective layer 52 is used as a means to protect the stack layers formed below the protective layer 52 from external impurities, especially moisture, and can be formed with a silicon oxide film with a thickness of about 1 μm (micron). A gap between the protective layer 52 and the fourteenth and fifteenth insulating layers 102 and 104 can be sealed using a sealing material such as a UV resin.

Thus, the manufacturing the first organic light emitting device depicted in FIG. 1 is completed.

When comparing FIG. 1 and FIG. 12, it is seen that the first insulating layer 34 is composed of the eighth, eleventh, and fourteenth insulating layers 90, 96, and 102. Also, the second insulating layer 40 is composed of the ninth and twelfth insulating layers 92 and 98, and the third insulating layer 42 is composed of the tenth, thirteenth, and fifteenth insulating layers 94, 100, and 104.

As described above, an organic light emitting device according to the present invention includes less than two transistors for the purpose of driving the organic light emitting device. Therefore, when compared to a conventional organic light emitting device, the volume of a unit cell and power consumption can be reduced. Also, a transistor and an organic light emitting device are formed in the same operation, thereby reducing the number of processes and increasing productivity. An organic light emitting device according to the present invention includes a bypass transistor between a cathode layer and an anode layer. The bypass transistor forms a detour for a portion of a signal when the frequency of the signal suddenly increases during the operation of the organic light emitting device. Therefore, the use of the organic light emitting device according to the present invention prevents a conventional overshooting problem.

While the present invention has been particularly shown and described with reference to embodiments thereof, it should not be construed as being limited to the embodiments set forth herein. For example, one skilled in the art could form the FET (field effect transistor) to a transistor instead of forming the first and second transistors T1 and T2. Also, the electron transfer layer 44 and/or the organic light emitting layer 48 may be formed in different configurations. Therefore, the scope of the present invention is defined by the technical spirit of the appended claims set forth herein.

What is claimed is:

1. A light emitting device comprising:
   a substrate;

a cathode layer and an anode layer spaced apart by a predetermined distance on said substrate;

an electron transfer layer and a light emitting layer sequentially stacked on said cathode layer;

a current control unit controlling current flow between said cathode layer and said anode layer, said current control unit being formed between said cathode layer and said anode layer;

a hole transfer layer spaced apart from said current control unit and connecting said light emitting layer and said anode layer;

a protective layer formed on said hole transfer layer;

a first insulating layer sealed by said protective layer and contacting outer surfaces of the layers stacked on said cathode layer;

a second insulating layer surrounding a portion of said current control unit to which an external voltage is applied; and a third insulating layer formed on said substrate adjacent to said anode layer, said third insulating layer contacting at least the outer surface of said anode layer and being sealed by said protective layer.

2. The light emitting device of claim 1, a metal layer spaced apart from said anode layer is provided on said substrate adjacent to said anode layer and a switching device for switching a voltage applied to said anode layer is disposed between said anode layer and said cathode layer.

3. The light emitting device of claim 2, wherein said switching device is a transistor which comprises a channel connecting said anode layer and said cathode layer and a second gate spaced apart a predetermined distance from the channel.

4. The light emitting device of claim 3, wherein the channel is a material layer formed on said substrate.

5. The light emitting device of claim 3, wherein the channel is a doped region formed in said substrate.

6. The light emitting device of claim 1, wherein said current control unit is a transistor which comprises a channel that connects said anode layer and said cathode layer, and a first gate spaced apart a predetermined distance from the channel.

7. The light emitting device of claim 6, wherein the channel is a doped region formed in said substrate.

8. The light emitting device of claim 6, wherein said channel is a material layer formed on said substrate.

9. The light emitting device of claim 8, wherein said material layer is a member selected from the group consisting of a semiconductor layer, a magnetic layer, and an organic semiconductor layer.

10. The light emitting device of claim 6, wherein the channel is a material layer formed above said first gate.

11. The light emitting device of claim 10, wherein said material layer is at least one member selected from the group consisting of a semiconductor layer, a magnetic layer, and an organic semiconductor layer.

12. The light emitting device of claim 1, with said electron transfer layer and said light emitting layer being formed in seriatim between said first and second insulating layers, said electron transfer layer further comprising a first layer and a second layer of different materials.

13. The light emitting device of claim 1, with said hole transfer layer directly contacting an entire top surface of said light emitting layer, covers an entire top and a side surface of said second insulating layer, and contacting directly an entire surface of said anode layer between said second insulating layer and said third insulating layer.

14. The light emitting device of claim 1, further comprising:

a first gate of said control unit is formed between said cathode and anode layer on said substrate, said first gate not contacting said cathode and anode layer;

a second gate with the same shape as said first gate is formed between said anode layer and a third metal layer patterns on said substrate;

a fourth insulating layer is disposed above said first gate between said cathode and anode layers and said first gate, said fourth insulating layer being planarized to the same height as said cathode and anode layers;

a fifth insulating layer is disposed above said second gate between said anode layer and third metal layer patterns and said second gate, said fifth insulating layer being planarized to the same height as said anode layer and said third metal layer patterns; and a first channel layer connected directly to said cathode and anode layers and a second channel layer connected to said anode layer and third metal layer patterns are respectively formed directly on said fourth insulating layer and the fifth insulating layer.

15. The light emitting device of claim 14, with at least one of said first and second channel layer further comprising a lower electrode, a hard magnetic film, a tunnelling film, a soft magnetic film, and an upper electrodes formed in seriatim on a predetermined region of said fourth insulating layer, said first and second channel layer further comprising a first spacer preventing said lower electrode, said hard magnetic film, and said tunnelling film from contacting said upper electrode, said first spacer being formed between a side surface of a stack including said lower electrode, said hard magnetic film, and said tunnelling film, and a portion extended along a side surface of a stack of the upper electrode, with the lower electrode being connected to said cathode layer, and an extended portion of the upper electrode being connected to said anode layer.

16. The light emitting device of claim 1, further comprising a resistance region being provided in said cathode layer.

17. The light emitting device of claim 1, wherein said light emitting layer is an organic light emitting layer.

18. The light emitting device of claim 17, wherein said organic light emitting layer is one selected from the group consisting of a low molecule fluorescent layer, a polymer fluorescent layer, and a phosphorescence layer generating a colored light.

19. The light emitting device of claim 1, with at least one of said first, second and third insulating layers comprising a plurality of layers.

20. The light emitting device of claim 1, further comprising of:

a first channel layer of said current control unit being between said cathode layer and said anode layer; and a second channel layer between said anode layer and a third metal layer pattern disposed on said substrate, with at least one of said first channel layer and said second channel layer further comprising a lower electrode contacting said cathode layer, a hard magnetic film, a tunneling film, a soft magnetic film, and an upper electrode directly contacting said anode layer, being formed in seriatim on said substrate, said hard magnetic film being a magnetic material film where the spins of molecules is fixed regardless of the magnetic field externally applied and said soft magnetic film being a magnetic material film where spins of molecules are arranged in a same direction or an opposite direction of the spin of said hard magnetic film according to the magnetic field applied externally.

21. The light emitting device of claim 20, with at least one of said first channel layer and said second channel layer, further comprising:
   a first spacer interposed between said lower electrode, said hard magnetic film, said tunneling film and said soft magnetic film, and said anode layer; and
   a second spacer between sides of said hard magnetic film, said tunneling film, said soft magnetic film and said upper electrode, and said cathode layer.

22. The light emitting device of claim 1, wherein said electron transfer layer is a single layer or a plurality of layers including first and second electron transfer layers stacked in seriatim.

23. The light emitting device of claim 22, wherein said first electron transfer layer is a calcium layer and said second electron transfer layer is one of a barium fluoride layer and a lithium fluoride layer.

24. The light emitting device of claim 1, further comprising a first gate of said current control unit and a second gate, said first gate being divided into each of a first color pixel, second color pixel and a third color pixel, said second gate commonly used by said first color, second color and third color pixels.

25. A light emitting device, comprising of:
   a substrate;
   a first metal layer and a second metal layer spaced apart by a predetermined distance and formed directly on said substrate, with one of said first metal layer and said second metal layer forming an anode layer and the other forming a cathode layer;
   an electron transfer layer and an organic light emitting layer formed in seriatim directly on said first metal layer;
   a current control unit controlling current flow between said first metal layer and said second metal layer, said current control unit being formed directly between said first metal layer and said second metal layer, said control unit comprising a channel connecting said second metal layer and said first metal layer, and a first gate spaced apart a predetermined distance from the channel;
   a hole transfer layer spaced apart from said current control unit and connecting said organic light emitting layer and said second metal layer;
   a first insulating layer contacting outer surfaces of the layers stacked on said first metal layer;
   a second insulating layer embedding a portion of said current control unit to which an external voltage is applied; and
   a third insulating layer formed on said substrate adjacent to said second metal layer, said third insulating layer contacting the outer surface of said second metal layer.

26. An apparatus, comprising:
   a substrate;
   a first metal layer and a second metal layer formed spaced apart on said substrate, with one of said first metal layer and said second metal layer being an anode layer and the other being a cathode layer;
   an electron transfer layer and a light emitting layer sequentially stacked on said first metal layer;
   a current control unit controlling current flow between said first metal layer and said second metal layer, said current control unit being formed directly between said first metal layer and said second metal layer;
   a hole transfer layer spaced apart from said current control unit and connecting said light emitting layer and said second metal layer;
   a protective layer formed on said hole transfer layer;
   a first insulating layer sealed by said protective layer and contacting outer surfaces of the layers stacked on said cathode layer;
   a second insulating layer encompassing a portion of said current control unit to which an external voltage is applied;
   a third insulating layer formed on said substrate adjacent to said second metal layer, said third insulating layer contacting an outer surface of said second metal layer; and
   a third metal layer spaced apart from said second metal layer is provided on said substrate adjacent to said second metal layer and a switching unit accommodating switching a voltage applied to said second metal layer is disposed between said second metal layer and said first metal layer,
   with at least one of said first insulating layer, second insulating layer, third insulating layer and said electron transfer layer comprising a plurality of layers.

* * * * *